United States Patent
Takeda et al.

(10) Patent No.: US 6,869,748 B2
(45) Date of Patent: Mar. 22, 2005

(54) RESIST COMPOSITION AND PATTERNING PROCESS

(75) Inventors: Takanobu Takeda, Niigata-ken (JP); Osamu Watanabe, Niigata-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/611,881

(22) Filed: Jul. 3, 2003

(65) Prior Publication Data

US 2004/0023153 A1 Feb. 5, 2004

(30) Foreign Application Priority Data

Jul. 4, 2002 (JP) ........................................ 2002-195740

(51) Int. Cl.⁷ ............................................. G03F 7/004
(52) U.S. Cl. .................... 430/270.1; 430/311; 430/296; 430/330; 430/917; 430/942
(58) Field of Search .............................. 430/270.1, 311, 430/296, 330, 917, 942; 525/330.3, 242, 223

(56) References Cited

U.S. PATENT DOCUMENTS

| | | |
|---|---|---|
| 4,491,628 A | 1/1985 | Ito et al. |
| 4,603,101 A | 7/1986 | Crivello |
| 5,310,619 A | 5/1994 | Crivello et al. |
| 5,994,025 A | 11/1999 | Iwasa et al. |

FOREIGN PATENT DOCUMENTS

| | | |
|---|---|---|
| EP | 0 829 766 A2 | 3/1998 |
| JP | 58118641 A | 7/1983 |
| JP | 62-115440 A | 5/1987 |
| JP | 63-27829 A | 2/1988 |
| JP | 2-27660 B2 | 6/1990 |
| JP | 3-223858 A | 10/1991 |
| JP | 3-275149 A | 12/1991 |
| JP | 4-211258 A | 8/1992 |
| JP | 6-100488 A | 4/1994 |
| JP | 6-289608 A | 10/1994 |
| WO | WO 03/006407 A1 | 1/2003 |

OTHER PUBLICATIONS

English language abstract of WO 03/006407.*

* cited by examiner

*Primary Examiner*—Amanda Walke
(74) *Attorney, Agent, or Firm*—Birch, Stewart, Kolasch & Birch, LLP

(57) ABSTRACT

Resist compositions comprising as the base resin a polymer using an alkoxyalkyl (meth)acrylate as a reactive group which is decomposable under the action of an acid to increase solubility in alkali have advantages including a practical level of shelf stability, a significantly enhanced contrast of alkali dissolution rate before and after exposure, a high sensitivity, and a high resolution over a wide baking temperature range. The compositions are best suited as a chemically amplified positive resist material for micropatterning in the manufacture of VLSI.

14 Claims, No Drawings

RESIST COMPOSITION AND PATTERNING PROCESS

This invention relates to a resist composition, typically chemically amplified positive resist composition suitable for the microfabrication of VLSI, comprising as the base resin a polymer containing an alkoxyalkyl (meth)acrylate having heat resistance as a reactive group which is decomposable under the action of an acid to increase solubility in alkali, the composition exhibiting shelf stability, a significantly high contrast of alkali dissolution rate before and after exposure, a high sensitivity, a high resolution and improved etch resistance.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a minimum feature size of 0.5 µm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. Nos. 4,491,628 and 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist material comprising poly-4-tert-butoxystyrene and a photoacid generator, and JP-A 3-223858 describes a similar two-component resist material comprising a resin bearing tert-butoxy groups within the molecule, in combination with a photoacid generator. JP-A 4-211258 describes a two-component resist material which is comprised of polyhydroxystyrene bearing methyl, isopropyl, tert-butyl, tetrahydropyranyl, and trimethylsilyl groups, together with a photoacid generator.

JP-A 6-100488 discloses a resist material comprised of a polydihydroxystyrene derivative, such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

To provide higher transparency and firm adhesion to substrates and to improve footing on substrates and etching resistance, JP-A 3-275149 and JP-A 6-289608 propose resist materials using copolymers of hydroxystyrene with a tertiary ester of (meth)acrylic acid. The resist materials of this type were still unsatisfactory because of poor resolution and an indefinite pattern profile after exposure. A further approach is a resist composition comprising a copolymer of hydroxystyrene with ethoxyethyl (meth)acrylate, which exhibited high resolution, but remained impractical because of very low thermal stability.

SUMMARY OF THE INVENTION

An object of the invention is to provide a resist composition, especially chemically amplified positive resist composition, which is superior to prior art positive resist compositions in sensitivity, resolution, exposure latitude and process flexibility, and has a satisfactory pattern profile after exposure and thermal stability.

It has been found that a polymer having at least recurring units of the general formula (1) or (2), shown below, and optionally recurring units of the general formula (3), shown below, and having a weight average molecular weight of 1,000 to 500,000 is an effective base resin in a positive resist composition, especially chemically amplified positive resist composition. The chemically amplified positive resist composition containing a photoacid generator and an organic solvent as well as the polymer has many advantages including an increased dissolution contrast of a resist film, high resolution, improved latitude of exposure, shelf stability, improved process flexibility, a good pattern profile after exposure, and an ability to form a resist film of reduced thickness compliant with a reduced feature size. The composition is thus suited for practical use and advantageously used in precise microfabrication, especially in VLSI manufacture.

In one embodiment, the invention provides a resist composition comprising a polymer comprising recurring units of the following general formula (1) and having a weight average molecular weight of 1,000 to 500,000.

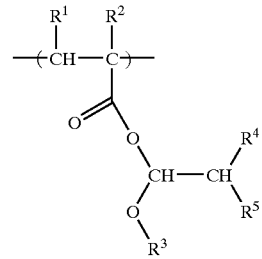

(1)

Herein $R^1$ and $R^2$ are each independently hydrogen, hydroxy, a straight or branched alkyl group, halogen atom or trifluoromethyl group, $R^3$ is methyl or ethyl, $R^4$ and $R^5$ each are an alkyl group having 1 to 7 carbon atoms, or $R^4$ and $R^5$ may bond together to form a cyclic structure.

In another embodiment, the invention provides a resist composition comprising a polymer comprising recurring units of the following general formula (2) and having a weight average molecular weight of 1,000 to 500,000.

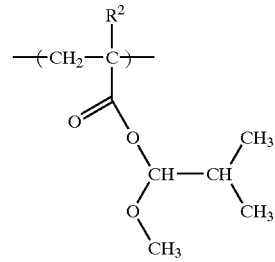

(2)

Herein $R^2$ is hydrogen, hydroxy, a straight or branched alkyl group, halogen atom or trifluoromethyl group.

In a further embodiment, the invention provides a resist composition comprising a polymer comprising recurring units of both the following general formulae (1) and (3) and having a weight average molecular weight of 1,000 to 500,000.

(1)

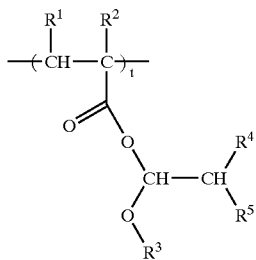

Herein $R^1$, $R^2$, $R^3$, $R^4$ and $R^5$ are as defined above, t is a positive number.

(3)

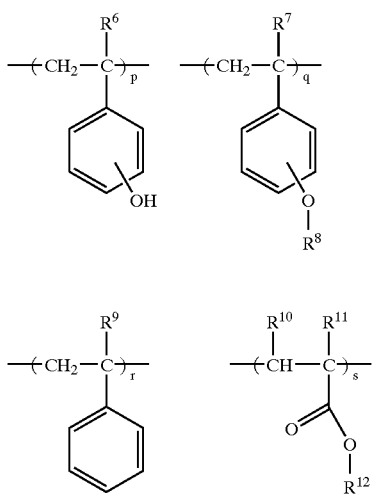

Herein $R^6$, $R^7$, $R^9$, $R^{10}$ and $R^{11}$ are each independently hydrogen, hydroxy, a straight or branched alkyl group, halogen atom or trifluoromethyl group, $R^8$ is an alkyl group having 1 to 10 carbon atoms, $R^{12}$ is an alkyl group having 4 to 30 carbon atoms or silicon-substituted alkyl group, q, r and s are 0 or positive numbers, and p is a positive number.

In a still further embodiment, the invention provides a resist composition comprising a polymer comprising recurring units of both the following general formulae (2) and (3) and having a weight average molecular weight of 1,000 to 500,000.

(2)

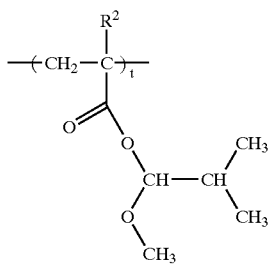

Herein $R^2$ and t are as defined above.

(3)

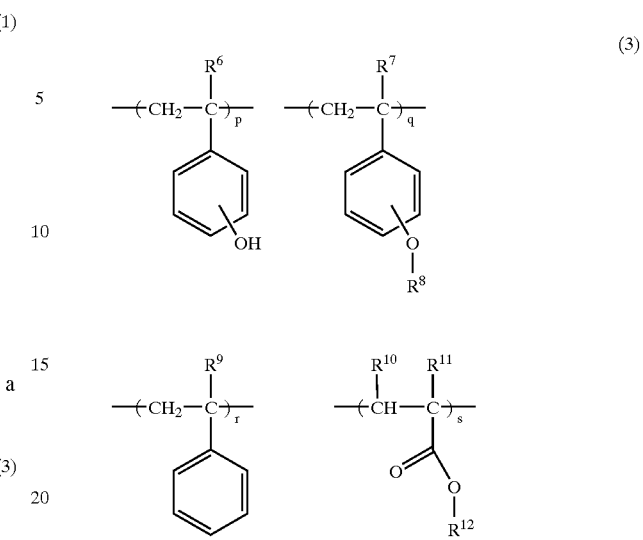

Herein $R^6$, $R^7$, $R^8$, $R^9$, $R^{10}$, $R^{11}$ and $R^{12}$ and p, q, r and s are as defined above.

In another aspect, the invention provides a chemically amplified positive resist composition comprising (A) an organic solvent, (B) the polymer as a base resin, and (C) a photoacid generator, or a chemically amplified positive resist composition comprising (A) an organic solvent, (B) the polymer as a base resin, (C) a photoacid generator, and (D) a dissolution inhibitor. The resist composition may further include (E) a basic compound.

In a further aspect, the invention provides a process for forming a resist pattern comprising the steps of applying the resist composition defined above onto a substrate to form a coating; heat treating the coating and then exposing it to high-energy radiation or electron beam through a photo mask; and optionally heat treating the exposed coating and developing it with a developer.

DESCRIPTION OF THE PREFERRED EMBODIMENT

Polymer

The resist compositions of the invention include polymers or high molecular weight compounds comprising recurring units of the following general formula (1) or (2), and optionally and additionally, recurring units of the following general formula (3), and having a weight average molecular weight of 1,000 to 500,000, as the base resin.

(1)

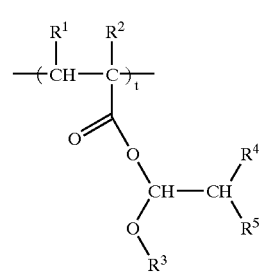

Herein $R^1$ and $R^2$ are each independently hydrogen, hydroxy, a straight or branched alkyl group, halogen atom or trifluoromethyl group. $R^3$ is methyl or ethyl. $R^4$ and $R^5$ each are an alkyl group having 1 to 7 carbon atoms, or $R^4$ and $R^5$ may bond together to form a cyclic structure having 3 to 7 carbon atoms, especially 5 to 6 carbon atoms. The subscript t is a positive number.

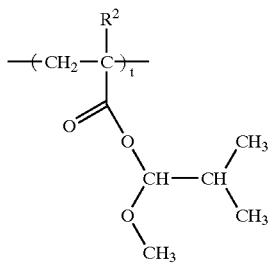
(2)

Herein $R^2$ is hydrogen, hydroxy, a straight or branched alkyl group, halogen atom or trifluoromethyl group, and t is a positive number.

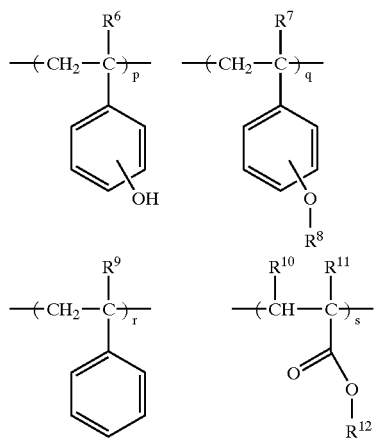
(3)

Herein $R^6$, $R^7$ $R^9$, $R^{10}$ and $R^{11}$ are each independently hydrogen, hydroxy, a straight or branched alkyl group, halogen atom or trifluoromethyl group, $R^8$ is an alkyl group having 1 to 10 carbon atoms, $R^{12}$ is an alkyl group having 4 to 30 carbon atoms or silicon-substituted alkyl group, q, r and s are 0 or positive numbers, and p is a positive number.

The straight or branched alkyl groups are preferably those having 1 to 6 carbon atoms, especially 1 to 5 carbon atoms, for example, methyl, ethyl, propyl, isopropyl, n-butyl, iso-butyl and tert-butyl.

In formula (1), $R^3$ is methyl or ethyl. When the thermal stability of the ester moiety is taken into account, methyl is most preferred and ethyl is next.

$R^4$ and $R^5$ are each independently alkyl groups, of which methyl and ethyl are preferred. When $R^4$ and $R^5$, taken together, form a cyclic structure, cyclohexyl and cyclopentyl groups are preferred. It is important for improving thermal stability that $R^4$ and $R^5$ are alkyl groups rather than hydrogen atoms.

The units of formula (1) are exemplified below.

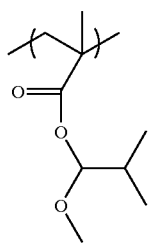
(1)-1

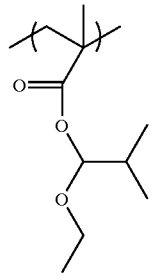
(1)-2

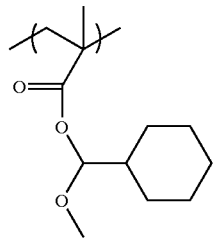
(1)-3

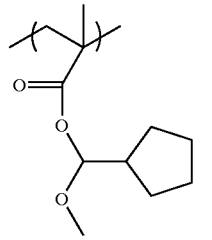
(1)-4

In formula (3), $R^8$ is an alkyl group, preferably methyl or ethyl. When $R^8$ serves as an acid labile group, tertiary alkyl groups having 4 to 10 carbon atoms such as t-butyl and t-amyl are preferred.

Of the halogen atoms represented by $R^1$, $R^2$, $R^6$, $R^8$, $R^9$, $R^{10}$ and $R^{11}$, fluorine, chlorine and bromine atoms are typical.

When the alkyl group represented by $R^{12}$ is a tertiary alkyl group, it is selected from a variety of such groups, preferably those groups of the general formulae (4) and (5) shown below.

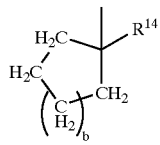
(4)

Herein, $R^{14}$ is a methyl, ethyl, isopropyl, cyclohexyl, cyclopentyl, vinyl, acetyl, phenyl, benzyl or cyano group, and b is an integer of 0 to 3.

The cyclic alkyl groups of formula (4) are preferably 5-membered rings. Examples include 1-methylcyclopentyl, 1-ethylcyclopentyl, 1-isopropylcyclopentyl, 1-vinylcyclopentyl, 1-acetylcyclopentyl, 1-phenylcyclopentyl, 1-cyanocyclopentyl, 1-methylcyclohexyl, 1-ethylcyclohexyl, 1-isopropylcyclohexyl, 1-vinylcyclohexyl, 1-acetylcyclohexyl, 1-phenylcyclohexyl, and 1-cyanocyclohexyl.

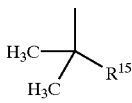
(5)

Herein, $R^{15}$ is a methyl, ethyl, isopropyl, cyclohexyl, cyclopentyl, vinyl, phenyl, benzyl or cyano group.

Illustrative examples of formula (5) include t-butyl, 1-vinyldimethyl, 1-benzyldimethyl, 1-phenyldimethyl and 1-cyanodimethyl.

Those alkyl groups which form tertiary esters as illustrated below are also preferred as $R^{12}$.

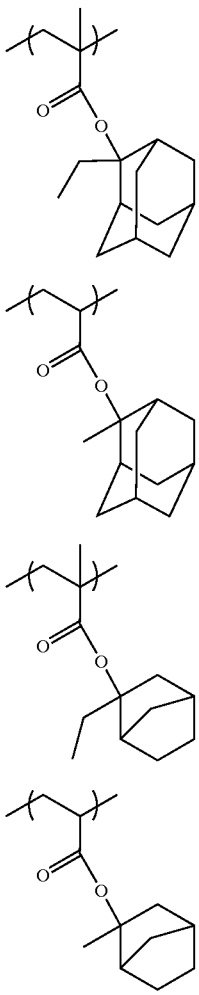

(4)-1

(4)-2

(4)-3

(4)-4

Of the silicon-substituted alkyl groups represented by $R^{12}$, tris(trimethylsilyl)silylethyl, tris(trimethylsiloxy)silylethyl and trimethylsilylethyl groups are preferred.

In formulae (1), (2) and (3), t and p are positive numbers, and q, r and s are 0 or positive numbers. In order for the resist composition to exhibit better properties, these subscripts should preferably satisfy the relationship: $0<t/(t+p+q+r+s)\leq0.3$, more preferably $0.05\leq t/(t+p+q+r+s)\leq0.2$; $0<p/(t+p+q+r+s)\leq0.8$, more preferably $0.5\leq p/(t+p+q+r+s)\leq0.8$; $0\leq q/(t+p+q+r+s)\leq0.25$; $0\leq r/(t+p+q+r+s)\leq0.35$; and $0\leq s/(t+p+q+r+s)\leq0.25$.

If t=0, meaning that the polymer does not contain the corresponding units, the contrast of alkali dissolution rate before and after exposure is lost, detracting from resolution. If the proportion of p is too high, the alkali dissolution rate in unexposed areas may become too high. When q and s are positive numbers, lithographic characteristics can be adjusted as desired by utilizing the inclusion of acid labile groups of two or more species. By properly selecting the values of p, q, r and s within the above range, the size and configuration of a resist pattern can be controlled as desired.

The polymer of the invention should have a weight average molecular weight (Mw) of 1,000 to 500,000, preferably 2,000 to 30,000. With too low a Mw, resists may be less resistant to heat. With too high a Mw, alkali solubility lowers and a footing phenomenon often occurs after pattern formation.

It is recommended that the multi-component copolymer of the invention have a controlled molecular weight dispersity (Mw/Mn). If a copolymer has a wide dispersity, it contains more fractions of low molecular weight and high molecular weight polymers and thus forms a pattern after exposure with foreign matter left thereon or its shape disrupted. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 2.0, especially 1.0 to 1.7.

In one typical embodiment, the polymer can be synthesized by dissolving an acetoxystyrene monomer, an alkoxyalkyl (meth)acrylate monomer and an additional monomer in an organic solvent, adding a radical initiator thereto, heat polymerizing the monomers, and subjecting the resulting polymer to alkaline hydrolysis in an organic solvent for deblocking the acetoxy group, thereby forming a multi-component copolymer of hydroxystyrene, alkoxyalkyl (meth)acrylate and additional component. Examples of the organic solvent used in polymerization include toluene, benzene, tetrahydrofuran, diethyl ether, and dioxane. Representative of the polymerization initiator are 2,2'-azobisisobutyronitrile, 2,2'-azobis(2,4-dimethylvaleronitrile), dimethyl-2,2-azobis(2-methylpropionate), benzoyl peroxide and lauroyl peroxide. Polymerization may be effected by heating at about 50 to 80° C. The reaction time is usually about 2 to 100 hours, preferably about 5 to 20 hours. The base used in the alkaline hydrolysis is selected from aqueous ammonia and triethylamine, to name a few. The reaction temperature is about −20° C. to 100° C., preferably about 0 to 60° C. The reaction time is usually about 0.2 to 100 hours, preferably about 0.5 to 20 hours. It is noted that the synthesis procedure is not limited to the aforementioned.

Resist Composition

The resist compositions of the invention are typically of the positive working type, and especially of the chemically amplified positive working type. In particular, the chemically amplified positive resist composition is comprised of (A) an organic solvent, (B) the polymer defined above as a base resin, and (C) a photoacid generator. Optionally, the composition further includes (D) a dissolution inhibitor and preferably (E) a basic compound.

In the chemically amplified, positive working resist composition of the invention, component (A) is an organic solvent. Illustrative, non-limiting, examples include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate.

It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the solids in the chemically amplified positive resist composition. The concentration is not limited to this range as long as film formation by existing methods is possible.

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodonium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4,4-toluenesulfonyloxybenzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bissulfonyldiazomethane compounds and sulfonylcarbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, fluoroglycine, catechol, resorcinol, and hydroquinone, in which all the hydroxyl groups are replaced by trifluoromethanesulfonate, nonafluorobutanesulfonate, heptadecafluorooctanesulfonate, 2,2,2- trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Photoacid generators in the form of glyoxime derivatives include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(p-toluenesulfonyl)-2-methyl-3,4-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(n-butanesulfonyl)-2,3-pentanedioneglyoxime,
bis-O-(n-butanesulfonyl)-2-methyl-3,4-pentanedioneglyoxime,
bis-O-(methanesulfonyl)-α-dimethylglyoxime,
bis-O-(trifluoromethanesulfonyl)-α-dimethylglyoxime,
bis-O-(1,1,1-trifluoroethanesulfonyl)-α-dimethylglyoxime,
bis-O-(tert-butanesulfonyl)-α-dimethylglyoxime,
bis-O-(perfluorooctanesulfonyl)-α-dimethylglyoxime,
bis-O-(cyclohexylsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-tert-butylbenzenesulfonyl)-α-dimethylglyoxime,
bis-O-(xylenesulfonyl)-α-dimethylglyoxime, and
bis-O-(camphorsulfonyl)-α-dimethylglyoxime.

Of these photoacid generators, the sulfonium salts, bis-sulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4,4-toluenesulfonyloxybenzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0.1 to 20 parts, more preferably 1 to 10 parts by weight per 100 parts by weight of the base resin (B) in the composition. The photoacid generators may be used alone or in admixture of two or more. The transmittance of the resist film can be controlled by using a photoacid generator having a low transmittance at the exposure wavelength and adjusting the amount of the photoacid generator added.

The dissolution inhibitor (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution inhibitor may fail to yield an improved resolution, whereas too much amounts would lead to slimming of the patterned film, and thus a decline in resolution.

Illustrative, non-limiting, examples of the dissolution inhibitor (D) which are useful herein include
bis(4-(2'-tetrahydropyranyloxy)phenyl)methane,
bis(4-(2'-tetrahydrofuranyloxy)phenyl)methane,
bis(4-tert-butoxyphenyl)methane,
bis(4-tert-butoxycarbonyloxyphenyl)methane,
bis(4-tert-butoxycarbonylmethyloxyphenyl)methane,
bis(4-(1'-ethoxyethoxy)phenyl)methane,
bis(4-(1'-ethoxypropyloxy)phenyl)methane,
2,2-bis(4'-(2"-tetrahydropyranyloxy))propane,
2,2-bis(4'-(2"-tetrahydrofuranyloxy)phenyl)propane,
2,2-bis(4'-tert-butoxyphenyl)propane,
2,2-bis(4'-tert-butoxycarbonyloxyphenyl)propane,
2,2-bis(4-tert-butoxycarbonylmethyloxyphenyl)propane,
2,2-bis(4'-(1"-ethoxyethoxy)phenyl)propane,
2,2-bis(4'-(1"-ethoxypropyloxy)phenyl)propane,
tert-butyl 4,4-bis(4'-(2"-tetrahydropyranyloxy)phenyl) valerate,
tert-butyl 4,4-bis(4'-(2"-tetrahydrofuranyloxy)phenyl) valerate,
tert-butyl 4,4-bis(4'-tert-butoxyphenyl)valerate,
tert-butyl 4,4-bis(4-tert-butoxycarbonyloxyphenyl)valerate,
tert-butyl 4,4-bis(4'-tert-butoxycarbonylmethyloxyphenyl) valerate,
tert-butyl 4,4-bis(4'-(1"-ethoxyethoxy)phenyl)valerate,
tert-butyl 4,4-bis(4'-(1"-ethoxypropyloxy)phenyl)valerate,
tris(4-(2'-tetrahydropyranyloxy)phenyl)methane,
tris(4-(2'-tetrahydrofuranyloxy)phenyl)methane,
tris(4-tert-butoxyphenyl)methane,
tris(4-tert-butoxycarbonyloxyphenyl)methane,
tris(4-tert-butoxycarbonyloxymethylphenyl)methane,
tris(4-(1'-ethoxyethoxy)phenyl)methane,
tris(4-(1'-ethoxypropyloxy)phenyl)methane,
1,1,2-tris(4'-(2"-tetrahydropyranyloxy)phenyl)ethane,
1,1,2-tris(4'-(2"-tetrahydrofuranyloxy)phenyl)ethane,
1,1,2-tris(4'-tert-butoxyphenyl)ethane,
1,1,2-tris(4'-tert-butoxycarbonyloxyphenyl)ethane,
1,1,2-tris(4'-tert-butoxycarbonylmethyloxyphenyl)ethane,
1,1,2-tris(4'-(1'-ethoxyethoxy)phenyl)ethane, and
1,1,2-tris(4'-(1'-ethoxypropyloxy)phenyl)ethane.

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \qquad (B)\text{-}1$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

(X)-1

(X)-2

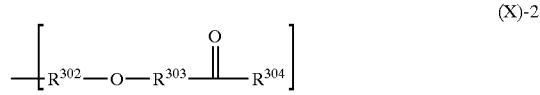

(X)-3

In the formulas, $R^{300}$, $R^{302}$ and $R^{305}$ are independently straight or branched alkylene groups of 1 to 4 carbon atoms; $R^{101}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

Illustrative examples of the compounds of formula (B)-1 include tris{2-methoxymethoxyethyl)amine, tris(2-(2-methoxyethoxy)ethyl}amine, tris{2-(2-methoxyethoxymethoxy)ethyl}amine, tris{2-(1-methoxyethoxy)ethyl}amine, tris(2-(1-ethoxyethoxy)ethyl)amine, tris(2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basis compound would result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dainippon Ink & Chemicals, Inc.), Florade FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin in the resist composition.

For the microfabrication of integrated circuits, any well-known lithography may be used to form a resist pattern from the resist composition of the invention.

The composition is applied onto a substrate (e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 μm thick. With a mask having a desired pattern placed above the resist film, the resist film is then exposed to actinic radiation, preferably having an exposure wavelength of up to 300 nm, such as UV, deep-UV, electron beams, x-rays, excimer laser light, γ-rays and synchrotron radiation in an exposure dose of about 1 to 200 mJ/cm$^2$, preferably about 10 to 100 mJ/cm$^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably 0.5 to 2 minutes by conventional techniques such as dipping, puddling or spraying. In this way, a desired resist pattern is formed on the substrate. It is appreciated that the resist composition of the invention is best suited for micropatterning using such actinic radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation AIBN is azobisisobutyronitrile, Mw is a weight average molecular weight, Mn is a number average molecular weight, Mw/Mn is a molecular weight dispersity, NMR is nuclear magnetic resonance, and GPC is gel permeation chromatography.

Synthesis Example 1

In a 2-liter flask were admitted 126.3 g of p-acetoxystyrene, 28.5 g of styrene, 10.6 g of methoxyisobutyl methacrylate and 400 g of toluene as a solvent. The reactor was cooled to −70° C. in a nitrogen atmosphere, whereupon vacuum deaeration and nitrogen flow were repeated three times. The reactor was warmed up to room temperature, 7.9 g of AIBN was added as a polymerization initiator, and the reactor was further heated to 60° C., at which reaction was effected for 20 hours. The reaction solution was concentrated to a ½ volume and poured into a mixture of 4.5 liters methanol and 0.2 liter water for precipitation. The resulting white solids were filtered and vacuum dried at 40° C., obtaining 182 g of a white polymer. The polymer was dissolved in a mixture of 0.3 liter methanol and 0.35 liter tetrahydrofuran again, to which 200 g of triethylamine and 40 g of water were added to effect deblocking reaction. The reaction solution was neutralized with acetic acid, concentrated, and dissolved in 0.5 liter of acetone. Following precipitation, filtration and drying in the same way as above, 127 g of a white polymer was obtained.

The polymer was analyzed by $^{13}$C-NMR, $^1$H-NMR and GPC, with the analytical results shown below.

Copolymer Compositional Ratio
p-hydroxystyrene:styrene:methoxyisobutyl methacrylate=72.0:15.7:12.3
Mw=15,700
Mw/Mn=1.62

This polymer is designated Polymer A.

Synthesis Example 2

In a 2-liter flask were admitted 125.0 g of p-acetoxystyrene, 25.5 g of styrene, 11.9 g of ethoxyisobutyl methacrylate and 400 g of toluene as a solvent. The reactor was cooled to −70° C. in a nitrogen atmosphere, whereupon vacuum deaeration and nitrogen flow were repeated three times. The reactor was warmed up to room temperature, 7.2 g of AIBN was added as a polymerization initiator, and the reactor was further heated to 60° C., at which reaction was effected for 20 hours. The reaction solution was concentrated to a ½ volume and poured into a mixture of 4.8 liters methanol and 0.2 liter water for precipitation. The resulting white solids were filtered and vacuum dried at 40° C., obtaining 177 g of a white polymer. The polymer was dissolved in a mixture of 0.3 liter methanol and 0.35 liter tetrahydrofuran again, to which 200 g of triethylamine and 40 g of water were added to effect deblocking reaction. The reaction solution was neutralized with acetic acid, concentrated, and dissolved in 0.5 liter of acetone. Following precipitation, filtration and drying in the same way as above, 117 g of a white polymer was obtained.

The polymer was analyzed by $^{13}$C-NMR, $^1$H-NMR and GPC, with the analytical results shown below.

Copolymer Compositional Ratio
p-hydroxystyrene:styrene:ethoxyisobutyl methacrylate=72.3:13.8:13.9
Mw=16,100
Mw/Mn=1.63

This polymer is designated Polymer B.

Synthesis Example 3

In a 2-liter flask were admitted 126.3 g of p-acetoxystyrene, 63.4 g of t-butoxystyrene, 10.3 g of methoxyisobutyl methacrylate and 400 g of toluene as a solvent. The reactor was cooled to −70° C. in a nitrogen atmosphere, whereupon vacuum deaeration and nitrogen flow were repeated three times. The reactor was warmed up to room temperature, 8.0 g of AIBN was added as a polymerization initiator, and the reactor was further heated to 60° C., at which reaction was effected for 20 hours. The reaction solution was concentrated to a ½ volume and poured into a mixture of 4.8 liters methanol and 0.2 liter water for precipitation. The resulting white solids were filtered and vacuum dried at 40° C., obtaining 177 g of a white polymer. The polymer was dissolved in a mixture of 0.3 liter methanol and 0.35 liter tetrahydrofuran again, to which 200 g of triethylamine and 40 g of water were added to effect deblocking reaction. The reaction solution was neutralized with acetic acid, concentrated, and dissolved in 0.5 liter of acetone. Following precipitation, filtration and drying in the same way as above, 122 g of a white polymer was obtained.

The polymer was analyzed by $^{13}$C-NMR, $^1$H-NMR and GPC, with the analytical results shown below.

Copolymer Compositional Ratio
p-hydroxystyrene:t-butoxystyrene:methoxyisobutyl methacrylate=74.7:19.1:6.2
Mw=14,900
Mw/Mn=1.57

This polymer is designated Polymer C.

Synthesis Example 4

In a 2-liter flask were admitted 121.1 g of p-acetoxystyrene, 58.4 g of t-amyloxystyrene, 10.0 g of methoxyisobutyl methacrylate and 400 g of toluene as a solvent. The reactor was cooled to −70° C. in a nitrogen atmosphere, whereupon vacuum deaeration and nitrogen flow were repeated three times. The reactor was warmed up to room temperature, 7.9 g of AIBN was added as a polymerization initiator, and the reactor was further heated to 60° C., at which reaction was effected for 20 hours. The reaction solution was concentrated to a ½ volume and poured into a mixture of 4.8 liters methanol and 0.2 liter water for precipitation. The resulting white solids were filtered and vacuum dried at 40° C., obtaining 175 g of a white polymer. The polymer was dissolved in a mixture of 0.3 liter methanol and 0.35 liter tetrahydrofuran again, to which 200 g of triethylamine and 40 g of water were added to effect deblocking reaction. The reaction solution was neutralized with acetic acid, concentrated, and dissolved in 0.5 liter of acetone. Following precipitation, filtration and drying in the same way as above, 118 g of a white polymer was obtained.

The polymer was analyzed by $^{13}$C-NMR, $^1$H-NMR and GPC, with the analytical results shown below.

Copolymer Compositional Ratio
p-hydroxystyrene:t-amyloxystyrene:methoxyisobutyl methacrylate=76.0:17.2:6.8
Mw=17,000
Mw/Mn=1.58

This polymer is designated Polymer D.

Synthesis Example 5

In a 2-liter flask were admitted 184.9 g of p-acetoxystyrene, 101.1 g of 2-ethyl-2-adamantyl methacrylate, 14.0 g of methoxyisobutyl methacrylate and 850 g of toluene as a solvent. The reactor was cooled to −70° C. in a nitrogen atmosphere, whereupon vacuum deaeration and nitrogen flow were repeated three times. The reactor was warmed up to room temperature, 16.0 g of AIBN was added as a polymerization initiator, and the reactor was further heated to 57° C., at which reaction was effected for 20 hours. The reaction solution was concentrated to a ½ volume and poured into a mixture of 4.8 liters methanol and 0.2 liter water for precipitation. The resulting white solids were filtered and vacuum dried at 40° C., obtaining 256 g of a white polymer. The polymer was dissolved in a mixture of 0.45 liter methanol and 0.50 liter tetrahydrofuran again, to which 300 g of triethylamine and 60 g of water were added to effect deblocking reaction. The reaction solution was neutralized with acetic acid, concentrated, and dissolved in 0.5 liter of acetone. Following precipitation, filtration and drying in the same way as above, 179 g of a white polymer was obtained.

The polymer was analyzed by $^{13}$C-NMR, $^{1}$H-NMR and GPC, with the analytical results shown below.
Copolymer Compositional Ratio
p-hydroxystyrene:2-ethyl-2-adamantyl methacrylate: methoxyisobutyl methacrylate=73.8:20.1:6.1
Mw=15,900
Mw/Mn=1.59

This polymer is designated Polymer E.

Synthesis Example 6

In a 2-liter flask were admitted 180.2 g of p-acetoxystyrene, 98.9 g of 2-methyl-2-adamantyl methacrylate, 14.7 g of methoxyisobutyl methacrylate and 850 g of toluene as a solvent. The reactor was cooled to −70° C. in a nitrogen atmosphere, whereupon vacuum deaeration and nitrogen flow were repeated three times. The reactor was warmed up to room temperature, 16.3 g of AIBN was added as a polymerization initiator, and the reactor was further heated to 57° C., at which reaction was effected for 20 hours. The reaction solution was concentrated to a ½ volume and poured into a mixture of 4.8 liters methanol and 0.2 liter water for precipitation. The resulting white solids were filtered and vacuum dried at 40° C., obtaining 248 g of a white polymer. The polymer was dissolved in a mixture of 0.45 liter methanol and 0.50 liter tetrahydrofuran again, to which 300 g of triethylamine and 60 g of water were added to effect deblocking reaction. The reaction solution was neutralized with acetic acid, concentrated, and dissolved in 0.5 liter of acetone. Following precipitation, filtration and drying in the same way as above, 173 g of a white polymer was obtained.

The polymer was analyzed by $^{13}$C-NMR, $^{1}$H-NMR and GPC, with the analytical results shown below.
Copolymer Compositional Ratio
p-hydroxystyrene:2-methyl-2-adamantyl methacrylate: methoxyisobutyl methacrylate=70.5:22.5:7.0
Mw=14,100
Mw/Mn=1.62

This polymer is designated Polymer F.

COMPARATIVE SYNTHESIS EXAMPLES

For comparison purposes, ternary polymers were synthesized by the same procedure as the foregoing Synthesis Examples. Their composition and analytical results are shown below.

Copolymer Compositional Ratio
p-hydroxystyrene:styrene:ethoxyethyl methacrylate=70.6:15.9:13.5
Mw=16,900
Mw/Mn=1.63

This polymer is designated Polymer G.

Copolymer Compositional Ratio
hydroxystyrene:t-amyloxystyrene:tetrahydropyranyl methacrylate=75.1:14.7:10.2
Mw=17,200
Mw/Mn=1.59

This polymer is designated Polymer H.

Polymers A to H obtained in Synthesis Examples and Comparative Synthesis Examples are shown below.

Polymer A

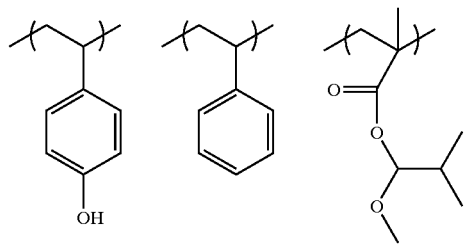

Polymer B

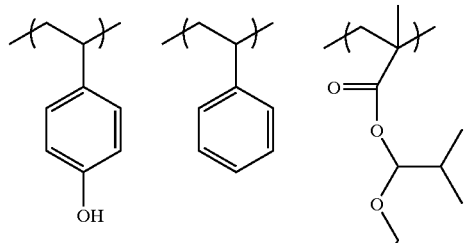

Polymer C

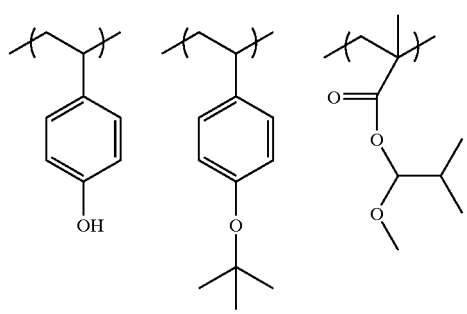

Polymer D

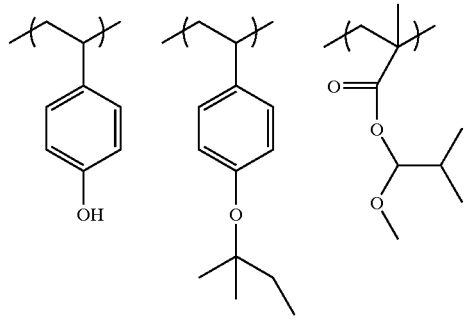

Polymer E

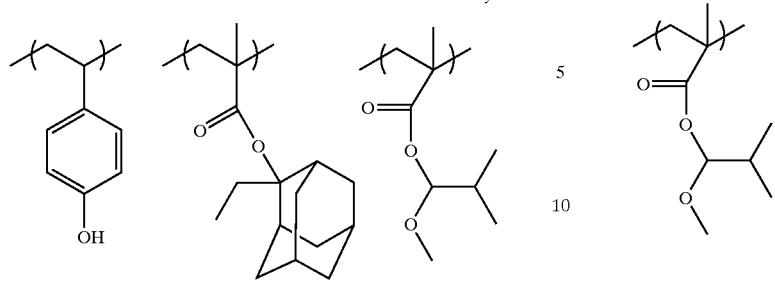

Polymer F

Polymer G

Polymer H

Experiment

Homopolymers having recurring units of the formulae (1)-1 to (1)-4, (H-1) and (H-2), shown below, were synthesized by a conventional radical polymerization process and measured for pyrolysis temperature by TG/DTA, with the results shown in Table 1. It is noted that measurement was done by heating from 70° C. to 400° C. at a rate of 1° C./min and determining the temperature at which the polymer first marked a weight loss as the pyrolysis temperature. Additionally, the incipient endothermic temperature and endothermic peak temperature were measured.

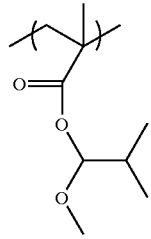

(1)-1

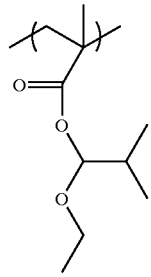

(1)-2

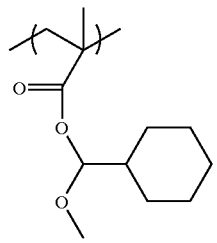

(1)-3

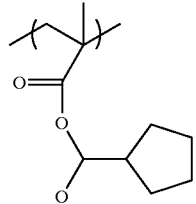

(1)-4

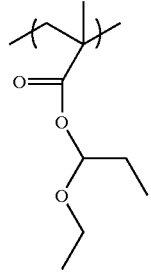

(H-1)

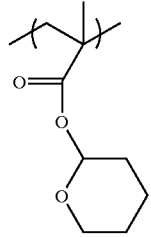

(H-2)

TABLE 1

| Polymer | Mw | Pyrolysis temperature | Incipient endothermic temperature | Endothermic peak temperature |
|---|---|---|---|---|
| (1)-1 | 10,200 | 162° C. | 180° C. | 201° C. |
| (1)-2 | 9,700 | 157° C. | 165° C. | 193° C. |
| (1)-3 | 9,600 | 155° C. | 163° C. | 198° C. |
| (1)-4 | 11,000 | 156° C. | 165° C. | 199° C. |
| (H)-1 | 10,500 | 139° C. | 145° C. | 188° C. |
| (H)-2 | 11,000 | 140° C. | 147° C. | 188° C. |

It is seen from the data that the polymers of alkoxyalkyl (meth)acrylates within the scope of the invention have a pyrolysis temperature above 150° C., suggesting that resist compositions comprising these polymers remain stable during shelf storage.

Examples 1–6 & Comparative Examples 1–2

Resist compositions were prepared according to the formulation shown in Tables 2 and 3. The polymers are Polymers A to H obtained in the above Synthesis Examples and Comparative Synthesis Examples, and the remaining components listed in Tables 2 and 3 have the following meaning.

PAG1: (4-butoxyphenyl)diphenylsulfonium 10-camphorsulfonate
PAG2: (4-tert-butylphenyl)diphenylsulfonium 4-(4'-methylphenylsulfonyloxy)phenylsulfonate
Dissolution inhibitor A: bis(4-(2-tetrahydropyranyloxy)phenyl)methane
Basic compound A: tris(2-methoxyethyl)amine
Surfactant A: FC-430 (Sumitomo 3M Co., Ltd.)
Surfactant B: Surflon S-381 (Asahi Glass Co., Ltd.)
Solvent A: propylene glycol methyl ether acetate
Solvent B: ethyl lactate

TABLE 2

| Component (pbw) | Example 1 | Example 2 | Example 3 | Example 4 |
|---|---|---|---|---|
| Polymer A | 80 | — | — | — |
| Polymer B | — | 80 | — | — |
| Polymer C | — | — | 80 | — |
| Polymer D | — | — | — | 80 |
| PAG1 | 2 | 2 | 2 | 2 |
| PAG2 | 1 | 1 | 1 | 1 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 3

| Component (pbw) | Example 5 | Example 6 | Comparative Example 1 | Comparative Example 2 |
|---|---|---|---|---|
| Polymer E | 80 | — | — | — |
| Polymer F | — | 80 | — | — |
| Polymer G | — | — | 80 | — |
| Polymer H | — | — | — | 80 |
| PAG1 | 2 | 2 | 2 | 1 |
| PAG2 | 1 | 1 | 1 | 1 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

The resist solutions thus obtained were each filtered through a 0.2-$\mu$m Teflon filter. These resist solutions were spin-coated onto silicon wafers, then baked on a hot plate at 100° C. for 90 seconds to give resist films having a thickness of 0.4 $\mu$m. The resist films were exposed using an excimer laser stepper NSR2005EX (Nikon Corp., NA 0.6), then baked at 110° C. for 90 seconds (post-exposure baking: PEB), and developed with a solution of 2.38% tetramethylammonium hydroxide in water, thereby giving positive patterns (Examples 1–6 and Comparative Examples 1–2).

The resulting resist patterns were evaluated as described below.

Resist Pattern Evaluation

The exposure dose which provides a 1:1 resolution at the top and bottom of a 0.15-$\mu$m line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope.

The PED stability of a resist was evaluated by effecting post-exposure bake (PEB) after 24 hours of holding from exposure at the optimum dose and determining a variation in line width. The less the variation, the greater is the PED dimensional stability.

The shelf stability of the resist composition was examined by passing a resist composition as prepared through a filter, holding the composition in a light-shielded state at 20° C. for 30 days, then subjecting to coating, exposure and development steps under the same conditions as above, and observing a cross section of the resist pattern again under a SEM. The resists which remained unchanged, changed somewhat and changed noticeably in sensitivity, resolution and pattern shape from the fresh resist were judged "Good," "Fair" and "Poor," respectively.

The results are shown in Table 4.

TABLE 4

| | Sensitivity (mJ/cm$^2$) | Resolution ($\mu$m) | Profile | 24 hr PED stability (nm) | Shelf stability @ 20° C./ 30 days |
|---|---|---|---|---|---|
| Example 1 | 28 | 0.12 | rectangular | −6 | Good |
| Example 2 | 25 | 0.12 | rounded head | −9 | Fair |
| Example 3 | 27 | 0.12 | rectangular | −5 | Good |
| Example 4 | 25 | 0.11 | rounded head | −8 | Good |
| Example 5 | 29 | 0.11 | rectangular | −5 | Good |
| Example 6 | 30 | 0.12 | rectangular | −4 | Good |
| Comparative Example 1 | 29 | 0.12 | rounded head | −20 | Poor |
| Comparative Example 2 | 30 | 0.13 | rounded head | −24 | Poor |

There have been described resist compositions in which a polymer using a thermally stable alkoxyalkyl (meth)acrylate as a reactive group which is decomposable under the action of an acid to increase solubility in alkali is blended as the base resin. The compositions have advantages including a practical level of shelf stability, a significantly enhanced contrast of alkali dissolution rate before and after exposure, a high sensitivity, and a high resolution over a wide baking temperature range. The compositions are best suited as a chemically amplified resist material for micropatterning in the manufacture of VLSI.

Japanese Patent Application No. 2002-195740 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a polymer comprising recurring units of the following general formula (1) and recurring units of the following general formula (3) and having a weight average molecular weight of 1,000 to 500,000,

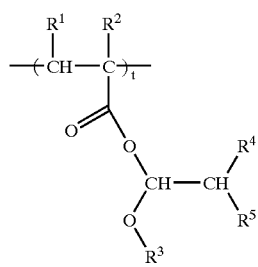

(1)

wherein $R^1$ and $R^2$ are each independently hydrogen, hydroxy, a straight or branched alkyl group, halogen atom or trifluoromethyl group, $R^3$ is methyl or ethyl, $R^4$ and $R^5$ each are an alkyl group having 1 to 7 carbon atoms, or $R^4$ and $R^5$ may bond together to form a cyclic structure, t is a positive number,

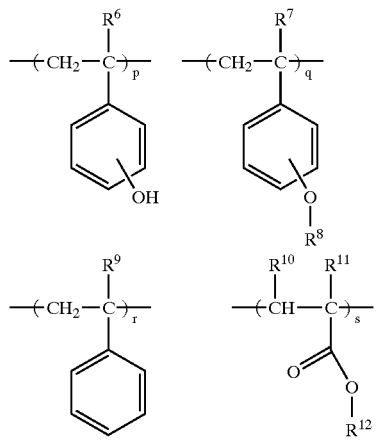

(3)

wherein $R^6$, $R^7$, $R^9$, $R^{10}$ and $R^{11}$ are each independently hydrogen, hydroxy, a straight or branched alkyl group, halogen atom or trifluoromethyl group, $R^8$ is an alkyl group having 1 to 10 carbon atoms, $R^{12}$ is an alkyl group having 4 to 30 carbon atoms or silicon-substituted alkyl group, q, r and s are 0 or positive numbers, and p is a positive number.

2. A resist composition comprising a polymer comprising recurring units of the following general formula (2) and recurring units of the following general formula (3) and having a weight average molecular weight of 1,000 to 500,000,

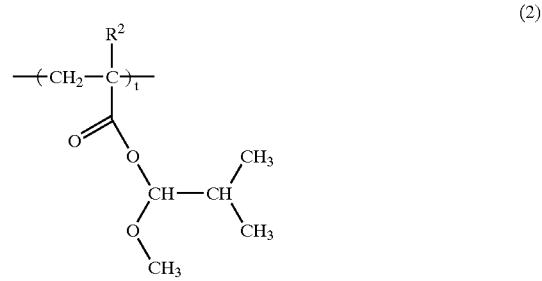

(2)

wherein $R^2$ is hydrogen, hydroxy, a straight or branched alkyl group, halogen atom or trifluoromethyl group, and t is a positive number,

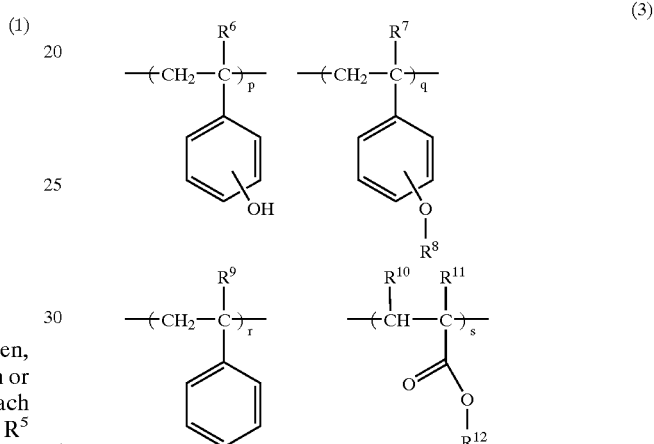

(3)

wherein $R^6$, $R^7$, $R^9$, $R^{10}$ and $R^{11}$ are each independently hydrogen, hydroxy, a straight or branched alkyl group, halogen atom or trifluoromethyl group, $R^8$ is an alkyl group having 1 to 10 carbon atoms, $R^{12}$ is an alkyl group having 4 to 30 carbon atoms or silicon-substituted alkyl group, q, r and s are 0 or positive numbers, and p is a positive number.

3. A chemically amplified positive resist composition comprising (A) an organic solvent, (B) the polymer of claim 1 as a base resin, and (C) a photoacid generator.

4. A chemically amplified positive resist composition comprising (A) an organic solvent, (B) the polymer of claim 1 as a base resin, (C) a photoacid generator, and (D) a dissolution inhibitor.

5. The chemically amplified positive resist composition of claim 3, further comprising (E) a basic compound.

6. A process for forming a resist pattern comprising the steps of:

applying the resist composition of claim 1 onto a substrate to form a coating, heat treating the coating and then exposing it to high-energy radiation or electron beam through a photo mask, and optionally heat treating the exposed coating and developing it with a developer.

7. A chemically amplified positive resist composition comprising
(A) an organic solvent,
(B) the polymer of claim 2 as a base resin, and
(C) a photoacid generator.

8. A chemically amplified positive resist composition comprising
(A) an organic solvent,
(B) the polymer of claim 2 as a base resin,
(C) a photoacid generator, and
(D) a dissolution inhibitor.

9. The chemically amplified positive resist composition of claim 7, further comprising (E) a basic compound.

10. A process for forming a resist pattern comprising the steps of:
applying the resist composition of claim 7, onto a substrate to form a coating,
heat treating the coating and then exposing it to high-energy radiation or electron beam through a photo mask, and
optionally heat treating the exposed coating and developing it with a developer.

11. A chemically amplified positive resist composition comprising
(A) an organic solvent,
(B) a polymer as a base resin comprising recurring units of the following general formula (1a) and having a weight average molecular weight of 1,000 to 500,000,

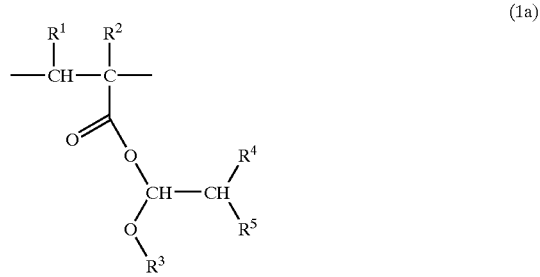

(1a)

wherein $R^1$ and $R^2$ are each independently hydrogen, hydroxy, a straight or branched alkyl group, halogen atom or trifluoromethyl group, $R^3$ is methyl or ethyl, $R^4$ and $R^5$ each are an alkyl group having 1 to 7 carbon atoms, or $R^4$ and $R^5$ may bond together to form a cyclic structure, (C) a photoacid generator, and
(D) a basic compound.

12. A chemically amplified positive resist composition comprising
(A) an organic solvent,
(B) a polymer as a base resin comprising recurring units of the following general formula (2a) and having a weight average molecular weight of 1,000 to 500,000,

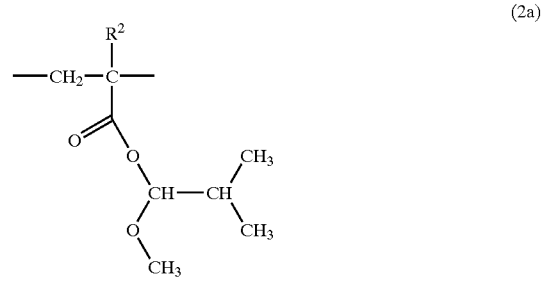

(2a)

wherein $R^2$ is a hydrogen, hydroxyl, a straight or branched alkyl group, halogen atom or trifluoromethyl group, (C) a photoacid generator, and
(D) a basic compound.

13. A process for forming a resist pattern comprising the steps of:
applying the resist composition of claim 11 onto a substrate to form a coating,
heat treating the coating and then exposing it to high-energy radiation or electron beam through a photo mask, and
optionally heat treating the exposed coating and developing it with a developer.

14. A process for forming a resist pattern comprising the steps of:
applying the resist composition of claim 12 onto a substrate to form a coating,
heat treating the coating and then exposing it to high-energy radiation or electron beam through a photo mask, and
optionally heat treating the exposed coating and developing it with a developer.

* * * * *